(12) United States Patent
Chen et al.

(10) Patent No.: US 12,359,309 B2
(45) Date of Patent: Jul. 15, 2025

(54) GROUP VI METAL DEPOSITION PROCESS

(71) Applicant: ENTEGRIS, INC., Billerica, MA (US)

(72) Inventors: Philip S. H. Chen, Bethel, CT (US);
Shawn D. Nguyen, Danbury, CT (US);
Bryan C. Hendrix, Danbury, CT (US);
Thomas H. Baum, New Fairfield, CT (US)

(73) Assignee: ENTEGRIS, INC., Billerica, MA (US)

( * ) Notice: Subject to any disclaimer, the term of this patent is extended or adjusted under 35 U.S.C. 154(b) by 480 days.

(21) Appl. No.: 17/002,646

(22) Filed: Aug. 25, 2020

(65) Prior Publication Data
US 2021/0062331 A1 Mar. 4, 2021

Related U.S. Application Data

(60) Provisional application No. 62/891,766, filed on Aug. 26, 2019.

(51) Int. Cl.
*C23C 16/06* (2006.01)
*C23C 16/455* (2006.01)
(Continued)

(52) U.S. Cl.
CPC ........ *C23C 16/06* (2013.01); *C23C 16/45553* (2013.01); *H01L 21/28506* (2013.01); *H01L 23/53257* (2013.01)

(58) Field of Classification Search
CPC .............. C23C 16/06; C23C 16/45525; C23C 16/45553; C23C 16/16
See application file for complete search history.

(56) References Cited

U.S. PATENT DOCUMENTS

| 4,431,708 A | 2/1984 | Carver |
| 7,078,341 B2 | 7/2006 | Yamasaki |

(Continued)

FOREIGN PATENT DOCUMENTS

| CN | 107937884 A | 4/2018 |
| CN | 109182996 A | 1/2019 |

(Continued)

OTHER PUBLICATIONS

Carver, G.E. et al.; "Chemical-vapor-deposited molybdenum films of high infrared reflectance"; Appl. Phys. Lett. 34, 279; 1979.
(Continued)

*Primary Examiner* — Nathan T Leong

(57) ABSTRACT

Provided is a process for the vapor deposition of molybdenum or tungsten, and the use of molybdenum hexacarbonyl ($Mo(CO)_6$) or tungsten hexacarbonyl ($W(CO)_6$) for such deposition, e.g., in the manufacture of semiconductor devices in which molybdenum-containing or tungsten-containing films are desired. In accordance with one aspect of the invention, molybdenum hexacarbonyl ($Mo(CO)_6$) has been found in vapor deposition processes such as chemical vapor deposition (CVD) to provide low resistivity, high deposition rate films in conjunction with a pulsed deposition process in which a step involving a brief pulse of $H_2O$ is utilized. This pulsing with $H_2O$ vapor was found to be effective in reducing the carbon content of films produced from $Mo(CO)_6$-based CVD processes.

16 Claims, 5 Drawing Sheets

(51) Int. Cl.
*H01L 21/285* (2006.01)
*H01L 23/532* (2006.01)

(56) References Cited

U.S. PATENT DOCUMENTS

| | | | |
|---|---|---|---|
| 7,094,691 | B2 | 8/2006 | Pan |
| 7,646,084 | B2 | 1/2010 | Suzuki |
| 10,676,826 | B2 | 6/2020 | Sundaram |
| 2003/0008070 | A1 | 1/2003 | Seutter |
| 2005/0069632 | A1* | 3/2005 | Yamasaki ......... C23C 16/45523 257/E21.585 |
| 2006/0222768 | A1* | 10/2006 | Faguet ................ C23C 16/4481 427/248.1 |
| 2009/0291549 | A1* | 11/2009 | Yamasaki ................ C23C 8/36 257/E21.328 |
| 2012/0175751 | A1 | 7/2012 | Gatineau |
| 2019/0003050 | A1 | 1/2019 | Dezelah |
| 2019/0027573 | A1* | 1/2019 | Zhu ..................... H01L 29/4966 |
| 2019/0067094 | A1* | 2/2019 | Zope ................ H01L 21/32051 |

FOREIGN PATENT DOCUMENTS

| | | |
|---|---|---|
| EP | 1828430 B1 | 8/2011 |
| WO | 2004010469 A2 | 1/2004 |
| WO | 2007109410 A3 | 11/2007 |
| WO | 2017143246 A1 | 8/2017 |

OTHER PUBLICATIONS

Kaplan, L.H. et al.; "The Deposition of Molybdenum and Tungsten Films from Vapor Decomposition of Carbonyls"; Journal Electrochem. Soc.: Solid State Science; pp. 693-700; May 1970.

* cited by examiner

GROUP VI METAL DEPOSITION PROCESS

FIELD OF THE INVENTION

This invention belongs to the field of thermal deposition of certain Group VI metal precursors to form, for example, molybdenum and tungsten metal onto microelectronic substrates.

BACKGROUND OF THE INVENTION

In consequence of its characteristics of extremely high melting point, low coefficient of thermal expansion, low resistivity, and high thermal conductivity, molybdenum is increasingly utilized in the manufacture of semiconductor devices, including use in diffusion barriers, electrodes, photomasks, power electronics substrates, low-resistivity gates, and interconnects.

Such utility has motivated efforts to achieve deposition of molybdenum films for such applications that is characterized by high conformality of the deposited film and high deposition rate to accommodate efficient high-volume manufacturing operations. This in turn has informed efforts to develop improved molybdenum source reagents useful in vapor deposition operations, as well as improved process parameters utilizing such reagents.

SUMMARY OF THE INVENTION

The present invention relates to vapor deposition of certain Group VI metals, such as tungsten and molybdenum, and the use of molybdenum hexacarbonyl ($Mo(CO)_6$) and tungsten carbonyl ($W(CO)_6$) for such deposition, e.g., in the manufacture of semiconductor devices in which molybdenum or tungsten films are desired. In one aspect of the present invention, molybdenum hexacarbonyl ($Mo(CO)_6$) has been found in vapor deposition processes such as chemical vapor deposition (CVD) to provide low resistivity, high deposition rate films in conjunction with a pulsed deposition process in which a step involving a brief pulse of $H_2O$ is utilized. In this regard, we have found this intermediate step of pulsing with $H_2O$ vapor to be effective in reducing the carbon content of films produced from $Mo(CO)_6$-based CVD processes. In one aspect, the invention relates to a process for forming a molybdenum-containing material on a substrate, comprising sequentially contacting the substrate with molybdenum hexacarbonyl vapor, $H_2O$ vapor, and a reducing gas, under vapor deposition conditions, to deposit the molybdenum-containing material on the substrate. The pulsing sequence is repeated until a desired film thickness has been achieved on the substrate.

DETAILED DESCRIPTION OF THE INVENTION

Figure 1:
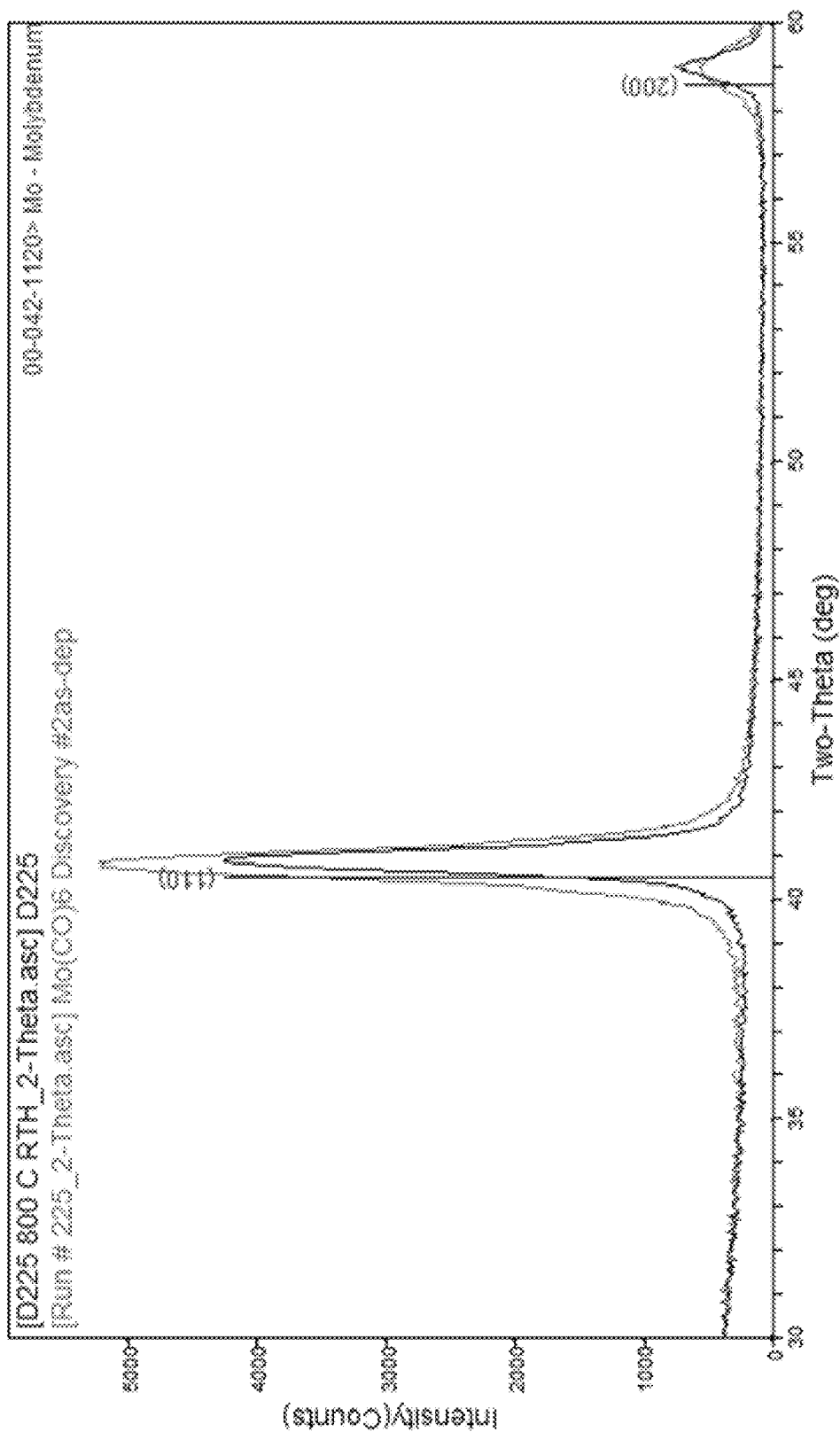
FIG. 1 is the X-ray diffraction pattern (XRD) of a molybdenum film utilizing the process of the invention, conducted at a stage temperature of 400° C. with $H_2$ co-reactant and $H_2O$ pulses as set forth in Example 1. No $Mo_2C$ was detected.
Figure 2:
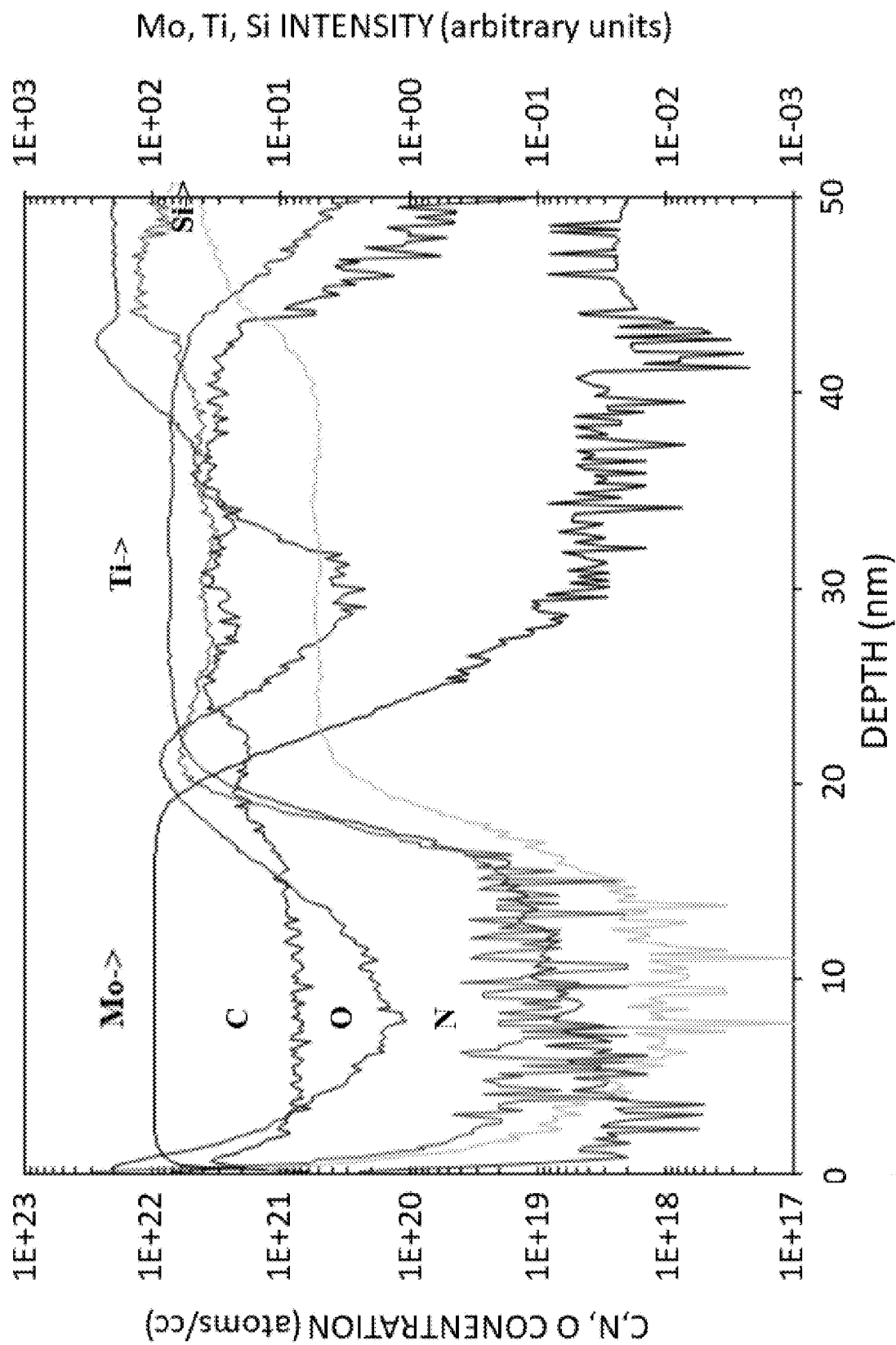
FIG. 2 is a Secondary Ion Mass Spectrum (SIMS) of the film prepared in Example 1, i.e., the 400° C. deposited Mo film. The carbon and oxygen impurity levels were 1.1 and 0.24 atomic %, respectively. An annealed resistivity of 12.4 μΩ·cm was the lowest value achieved from $Mo(CO)_6$. The carbon, nitrogen, and oxygen concentrations in atoms per cc are depicted on the vertical axis on the left and the molybdenum, silicon, and titanium intensity is depicted in arbitrary units is depicted on the right vertical axis.
Figure 3:
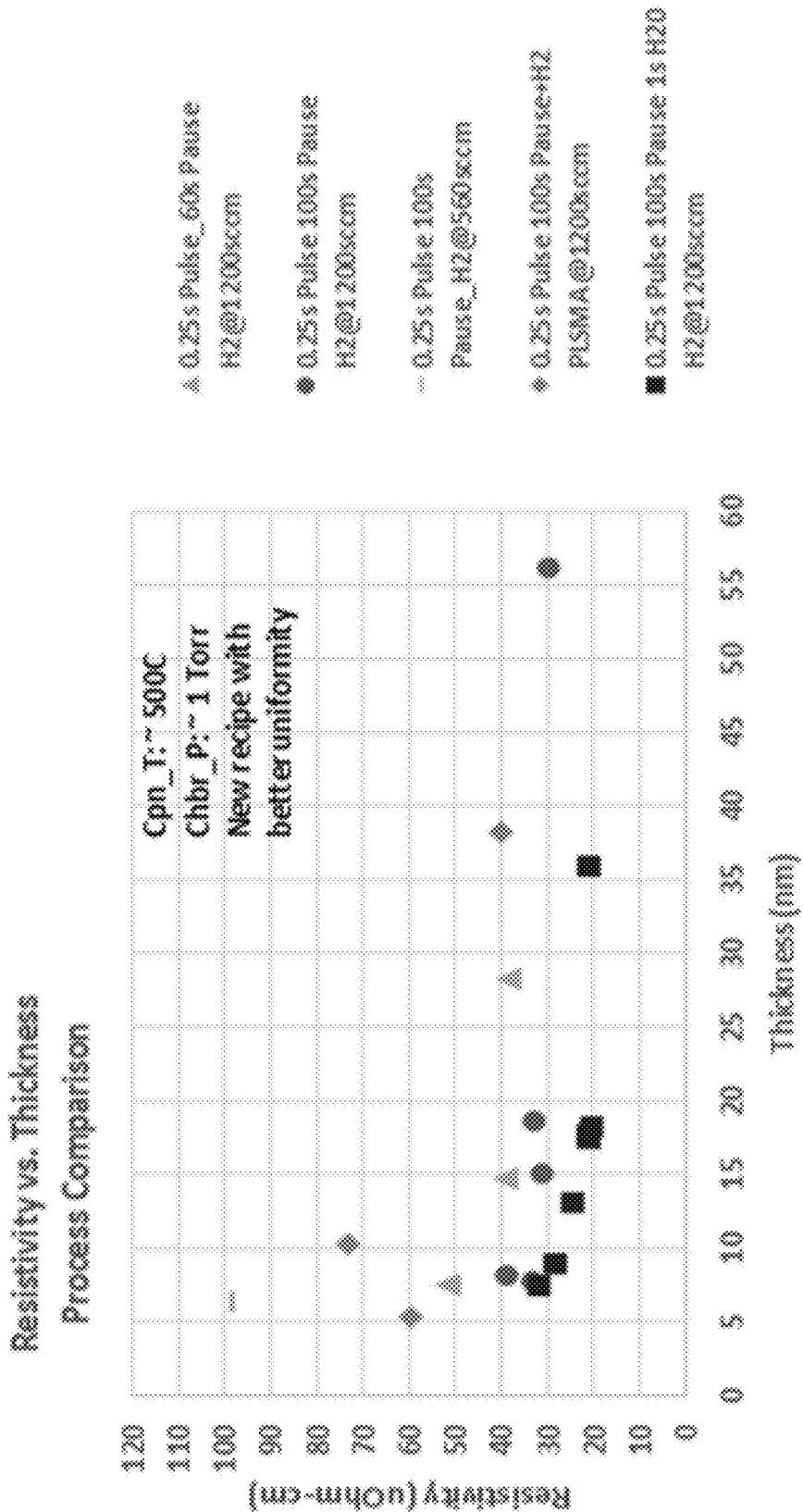
FIG. 3 illustrates the effect of shorter pulse intervals for $Mo(CO)_6$ and $H_2O$ in yielding films with lower resistivity. A 0.25 second pulse of $Mo(CO)_6$ followed by 100 seconds of $H_2$ at a flow rate of 1200 sccm (dots) achieved as an as-deposited resistivity of about 30 μΩ-cm. Additions of 1 second pulse of $H_2O$ vapor followed the $Mo(CO)_6$ pulse (squares) reduce the as-deposited resistivity to about 20 μΩ-cm.
Figure 4:
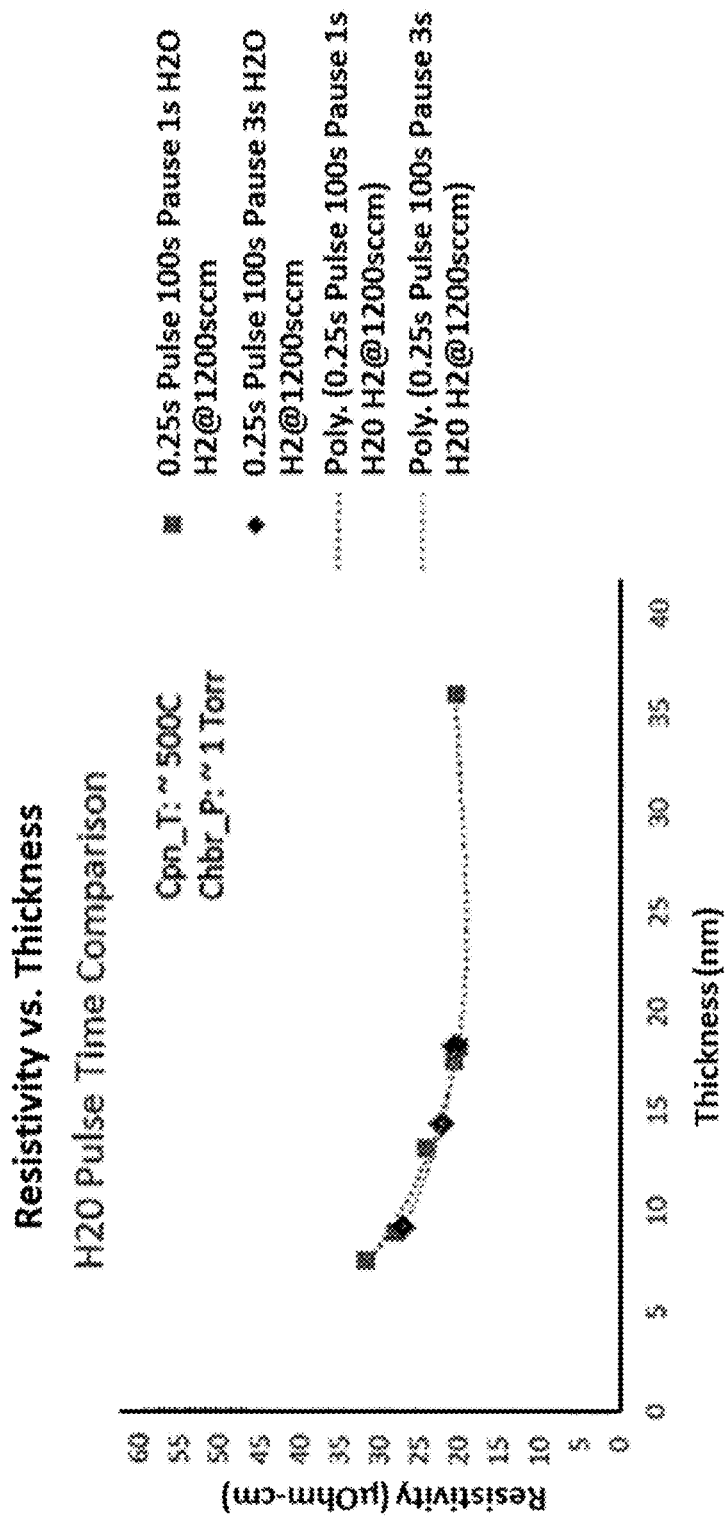
FIG. 4 compares resistivity of the resulting Mo film using pulse times of 1 second and 3 seconds of $H_2O$ and shows that increasing pulse interval does not improve resistivity.
Figure 5:
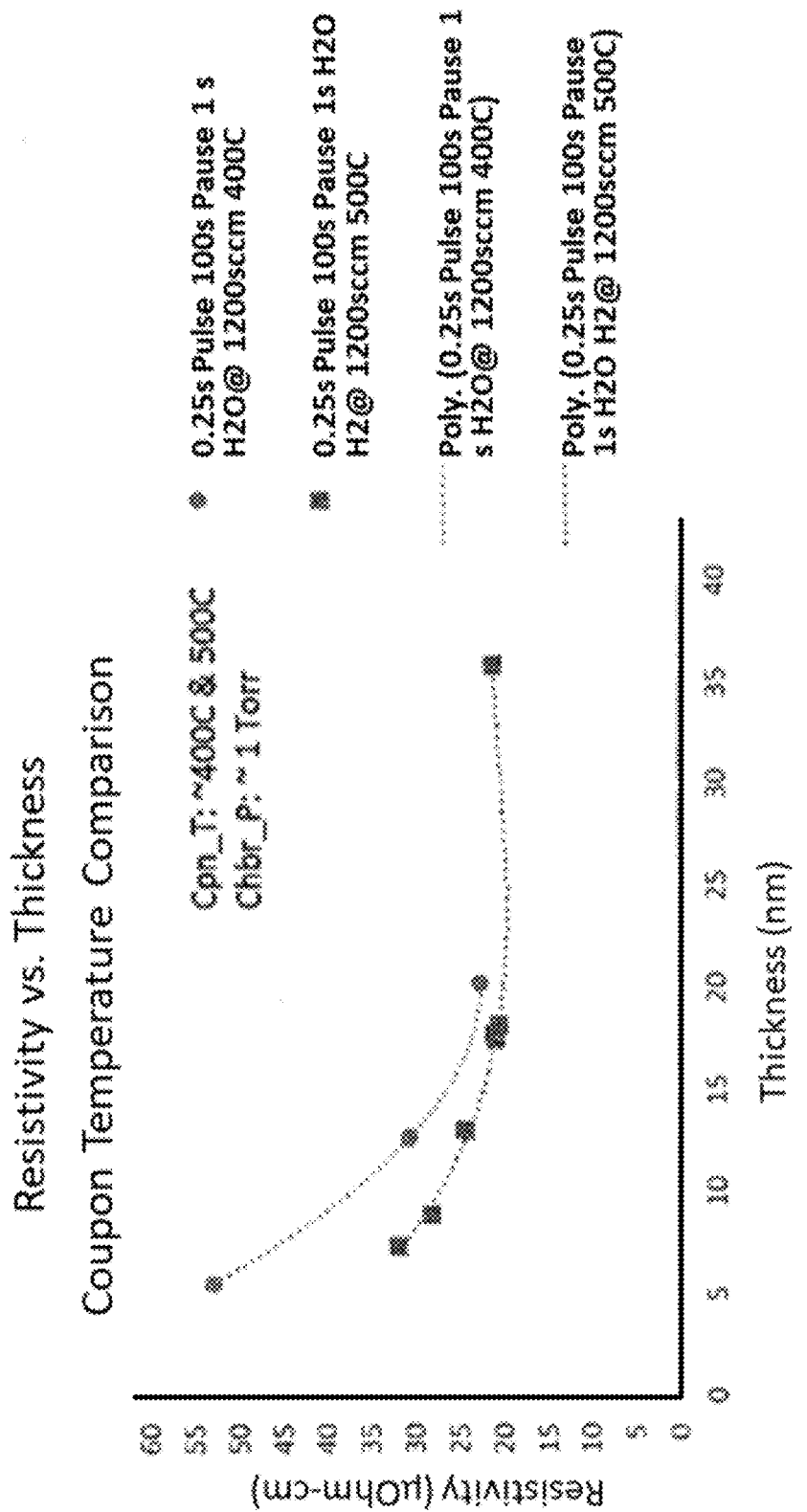
FIG. 5 illustrates the effect of 400° C. vs 500° C. deposition temperature on as-deposited resistivity.

The present invention relates to vapor deposition of certain Group VI metal-containing compounds, such as molybdenum and tungsten, and the use of molybdenum hexacarbonyl ($Mo(CO)_6$) and tungsten carbonyl ($W(CO)_6$) for such deposition, e.g., in the manufacture of microelectronic devices in which molybdenum or tungsten films are desired. In one aspect of the present invention, molybdenum hexacarbonyl ($Mo(CO)_6$) has been found in vapor deposition processes such as chemical vapor deposition (CVD) to provide low resistivity, high deposition rate films. In one aspect, the invention relates to a process for forming a molybdenum-containing material on a substrate, comprising contacting the substrate with molybdenum hexacarbonyl ($Mo(CO)_6$) vapor under vapor deposition conditions, to deposit the molybdenum-containing material on the substrate. It has been found that in various embodiments of the invention, the use of molybdenum hexacarbonyl ($Mo(CO)_6$) as a precursor for vapor deposition of molybdenum-containing material on substrates, followed by a pulse step of an oxidizing gas, such as $H_2O$ vapor, followed by a reducing gas, for example $H_2$, can provide a molybdenum film with as-deposited resistivity of less than 25 μΩ-cm. Further, the films of the invention have a reduced carbon content versus what typically results from the use of $Mo(CO)_6$ as precursor, in general, less than 5%, or less than 2, or less than 1.2% (atomic percentage) carbon. Thus, in a first aspect, the invention provides a process for forming a molybdenum-containing material or a tungsten-containing material on a substrate, comprising contacting the substrate with $Mo(CO)_6$ or $W(CO)_6$, respectively, under pulsed vapor deposition conditions, wherein the pulsed vapor deposition conditions comprise:

(i) exposure of the substrate to $Mo(CO)_6$ or $W(CO)_6$;
(ii) exposure of the substrate to an oxidizing gas; and
(iii) exposure of the substrate to a reducing gas.

In certain embodiments, (i), (ii), and (iii) are steps conducted sequentially. In other embodiments, (i), (ii), and (iii) are repeated until a desired thickness of a molybdenum or tungsten containing film has been deposited on the substrate.

In certain embodiments of the present invention, the oxidizing gas is comprised of gases chosen from $H_2O$ vapor, $H_2O_2$, $O_3$, and $N_2O$. In certain embodiments of the present invention, the reducing gas is comprised of gases chosen from $H_2$, hydrazine ($N_2H_4$), methyl hydrazine, t-butyl hydrazine, 1,1-dimethylhydrazine, 1,2-dimethylhydrazine, and $NH_3$. It will be appreciated that given the oxidative potentials of $H_2O_2$ and $O_3$, such gasses should not be utilized in conjunction with hydrazine ($N_2H_4$), methyl hydrazine, t-butyl hydrazine, 1,1-dimethylhydrazine, or 1,2-dimethylhydrazine, or if utilized sequentially, any such gases remaining from such a step should be purged from the reactor before exposure of the substrate to the other reactant.

In certain embodiments, (i) is followed by a combination of (ii) and (iii), with the proviso that the reducing gas is utilized in a molar excess relative to the oxidizing gas, and further with the proviso that when the reducing gas is hydrazine, methyl hydrazine, t-butyl hydrazine, 1,1-dimethylhydrazine, or 1,2-dimethylhydrazine the oxidizing gas is other than $H_2O_2$ and $O_3$.

The $Mo(CO)_6$ or $W(CO)_6$ may be deposited at a pressure in the range of from about 0.1 to 50 Torr, or in the range of from 0.5 Torr to 25 Torr, or in the range of from 1 to 5 Torr.

In one embodiment, a three step pulse sequence is generally comprised of $Mo(CO)_6$ (or $W(CO)_6$) vapor, followed by $H_2O$, followed by a reducing gas such as $H_2$, hydrazine, methyl hydrazine, t-butyl hydrazine, 1,1-dimethylhydrazine, or 1,2-dimethylhydrazine, followed by $Mo(CO)_6$ vapor, etc., until a desired thickness of Mo(or W) film has been obtained. In certain embodiments, the pulse duration of $Mo(CO)_6$ or $W(CO)$ vapor is from about 100 micro seconds to about 1 second, or about 500 microseconds to about 0.5 seconds, or from about 0.15 to about 0.35 seconds, or about 0.25 seconds. In certain embodiments, the pulse duration of the oxidizing gas exposure (e.g., $H_2O$ vapor) is about 0.5 to about 3 seconds, or about 0.8 seconds to about 1.2 seconds, or about 1 second. In certain embodiments, the pulse duration of the reducing gas exposure is about 50 seconds to about 200 seconds, or about 75 seconds to about 125 seconds, or about 100 seconds.

In various embodiments, the vapor deposition conditions comprise an inert atmosphere, save for the steps involving oxidizing gas and a reducing gas.

The vapor deposition conditions may be of any suitable type, and may for example comprise a reducing ambient (vapor) such as hydrogen, hydrazine, methyl hydrazine, t-butyl hydrazine, 1,1-dimethylhydrazine, or 1,2-dimethylhydrazine, so that the molybdenum-containing (or tungsten-containing) material comprises elemental molybdenum (or tungsten) material in the deposited film. The molybdenum-containing (or tungsten-containing) material so deposited may comprise, or alternatively consist, or consist essentially of, elemental molybdenum, or molybdenum oxide, or other molybdenum-containing material or tungsten, tungsten oxide, or other tungsten-containing material.

In one embodiment, the molybdenum or tungsten-containing layer deposited on the substrate surface may for example be formed by pulsed chemical vapor deposition (CVD) or atomic layer deposition (ALD) or other vapor deposition technique, without the prior formation of a nucleation layer and thus directly with molybdenum hexacarbonyl $(Mo(CO)_6)$ vapor or tungsten hexacarbonyl $(W(CO)_6)$ vapor. The respective molybdenum or tungsten hexacarbonyl $(Mo(CO)_6)$vapor contacting steps, oxidizing gas (e.g., $H_2O$ vapor), and reducing gas steps may be carried out repetitively for as many cycles as are desired to form the desired thickness of the molybdenum film.

As used herein, the term "microelectronic device" corresponds to semiconductor substrates, including 3D NAND structures, flat panel displays, and microelectromechanical systems (MEMS), manufactured for use in microelectronic, integrated circuit, or computer chip applications. It is to be understood that the term "microelectronic device" is not meant to be limiting in any way and includes any substrate that includes a negative channel metal oxide semiconductor (nMOS) and/or a positive channel metal oxide semiconductor (pMOS) transistor and will eventually become a microelectronic device or microelectronic assembly. The semiconductor device may be of any suitable type, and may for example comprise a DRAM device, 3-D NAND device, or other device or device integrated structure. In various embodiments, the substrate may comprise a via in which the molybdenum-containing material is deposited. The device may, for example, have an aspect ratio of depth to lateral dimension that is in a range of from 10:1 to 40:1. In still other embodiments, the device may be a film used in a flat-panel display or mobile device.

The substrates located on such microelectronic devices utilized in the deposition process of the invention may be of any suitable type, and may for example comprise a semiconductor device substrate, e.g., a silicon substrate, a silicon dioxide substrate, or other silicon-based substrate. In various embodiments, the substrate may comprise one or more metallic or dielectric substrates, for example, Co, Cu, Al, W, WN, WC, TiN, Mo, MoC, $SiO_2$, W, SiN, WCN, $Al_2O_3$, AlN, $ZrO_2$, $HfO_2$, $SiO_2$, lanthanum oxide ($La_2O_3$), tantalum nitride (TaN), ruthenium oxide ($RuO_2$), iridium oxide ($IrO_2$), niobium oxide ($Nb_2O_3$), and yttrium oxide ($Y_2O_3$).

In certain embodiments, for example in the case of an oxide substrate such as silicon dioxide, or alternatively a silicon or polysilicon substrate, the substrate may be processed or fabricated to include a barrier layer thereon, e.g., titanium nitride, for subsequently deposited material.

In a further aspect, the invention provides a process for forming a molybdenum-containing material on a substrate, wherein the substrate is chosen from titanium nitride, tantalum nitride, aluminum nitride, aluminum oxide, zirconium oxide, hafnium oxide, silicon dioxide, silicon nitride, lanthanum oxide, ruthenium oxide, iridium oxide, niobium oxide, and yttrium oxide, comprising contacting the substrate with $Mo(CO)_6$, under pulsed vapor deposition conditions, wherein the pulsed vapor deposition conditions comprise:

(i) exposure of the substrate to $Mo(CO)_6$ for a period of about 100 microseconds to about one second;

(ii) exposure of the substrate to $H_2O$ vapor for a period of about 0.8 to about 1.2 seconds; and (iiI) exposure of the substrate to hydrogen gas for a period of about 75 seconds to about 125 seconds.

In certain embodiments, (i), (ii), and (iii) are steps conducted sequentially. In other embodiments, (i), (ii), and (iii) are repeated until a desired thickness of a molybdenum-containing material has been deposited on the substrate.

The molybdenum or tungsten-containing material deposited in accordance with the method of the present invention may be characterized by any appropriate evaluation metrics and parameters, such as deposition rate of the molybdenum-containing material, the carbon content of the molybdenum-containing material, film resistivity of the deposited molybdenum-containing material, film morphology of the deposited molybdenum or tungsten-containing material, film stress of the deposited molybdenum or tungsten-containing material, step coverage of the material, and the process window or process envelope of appropriate process conditions. Any appropriate evaluation metrics and parameters may be employed, to characterize the deposited material and correlate same to specific process conditions, to enable mass production of corresponding semiconductor products. Advantageously, the process of the invention is capable of depositing a film of high purity molybdenum or tungsten onto a microelectronic device. In the case of molybdenum, the films were found to have a number of desirable qualities. Accordingly, in a further aspect, the invention provides a microelectronic device having a molybdenum film deposited thereon, wherein said film comprises greater than 95% molybdenum, less than 1% oxygen, less than 4% of carbon, and a resistivity of less than 25 μΩ·CM when measured on a film having a thickness of 200 Å.

This invention can be further illustrated by the following examples of certain embodiments thereof, although it will be understood that these examples are included merely for purposes of illustration and are not intended to limit the scope of the invention unless otherwise specifically indicated.

EXAMPLES

General Procedure:

A semiconductor device may be fabricated by the following sequence of process steps on the substrate comprising a titanium nitride barrier layer on the silicon dioxide base layer.

Step 1: Purging the deposition chamber;
Step 2: contacting the barrier layer (TiN layer) of the substrate with a pulse of molybdenum hexacarbonyl ($Mo(CO)_6$), followed by a pulse of $H_2O$ vapor, followed by hydrogen ($H_2$), for example at temperature on the order of 400° C.;
Step 3; The system is purged under $H_2$ or inert gas (e.g., Ar) to allow for complete reaction of the molybdenum hexacarbonyl ($Mo(CO)_6$) with the $H_2$ co-reactant and substrate.
Step 4: repeating Steps 1-3 as necessary to form a molybdenum film layer of desired characteristics.

Example 1

|  | CVD Temp (° C.) | XRF Mo thickness (Å) | As-deposited Resistivity (μΩ-cm) | As deposited XRF C (μg/cm²/10 nm Mo) | 800° C. Annealed Resistivity (μΩ · cm) | 800° C. RTH XRF C (μΩ · cm/10 nm Mo) |
| --- | --- | --- | --- | --- | --- | --- |
| Example A | 500 | 170.8 | 22.7 | 0.27 | 14.0 | 0.21 |
| Example B | 400 | 198.0 | 23.7 | 0.29 | 12.4 | 0.15 |

Example 2

Step 1: Purging the deposition chamber;
Step 2: Contacting the barrier layer (TiN layer) of the substrate with a pulse of molybdenum hexacarbonyl ($Mo(CO)_6$), followed by hydrogen ($H_2$), for example at temperature on the order of 500° C.;
Step 3; The system is purged under $H_2$ or inert gas (e.g., Ar) to allow for complete reaction of the molybdenum hexacarbonyl ($Mo(CO)_6$) with the $H_2$ co-reactant and substrate.
Step 4: repeating Steps 1-3 as necessary to form a molybdenum film layer of desired characteristics.

| Co-reactant | CVD Temperature (° C.) | XRF Mo (nm) | As-deposited Resistivity (μΩ · cm) |
| --- | --- | --- | --- |
| Without $H_2O$ pulse | 500 | 18.7 | 32.9 |
| With $H_2O$ pulse | 500 | 18.3 | 20.3 |

The invention claimed is:

1. A process for forming a molybdenum-containing material or a tungsten-containing material on a substrate, comprising contacting the substrate with $Mo(CO)_6$ or $W(CO)_6$, respectively, under pulsed vapor deposition conditions, wherein the pulsed vapor deposition conditions comprise:
   (i) exposure of the substrate to $Mo(CO)_6$ or $W(CO)_6$;
   (ii) exposure of the substrate to an oxidizing gas; and
   (iii) exposure of the substrate to a reducing gas, and
   wherein the molybdenum-containing material or tungsten containing material has a lower resistivity than material deposited without exposure of the substrate to the oxidizing gas and wherein gases used during exposure of the substrate to the oxidizing gas consist essentially of one or more oxidizing gases and optionally one or more inert gases.

2. The process of claim 1, wherein the substrate is chosen from titanium nitride, tantalum nitride, aluminum nitride, aluminum oxide, zirconium oxide, hafnium oxide, silicon dioxide, silicon nitride, lanthanum oxide, ruthenium oxide, iridium oxide, niobium oxide, and yttrium oxide.

3. The process of claim 1, wherein the exposure of the substrate to $Mo(CO)_6$ is conducted at a temperature of from about 250° to about 750° C.

4. The process of claim 1, wherein the exposure of the substrate to $W(CO)_6$ is conducted at a temperature of from about 250° to about 750° C.

5. The process of claim 1, wherein the one or more oxidizing gases are selective from the group consisting of $H_2O$ vapor, $H_2O_2$, $O_3$, and $N_2O$.

6. The process of claim 1, wherein the reducing gas is comprised of gases chosen from $H_2$, hydrazine, methyl hydrazine, t-butyl hydrazine, 1,1-dimethylhydrazine, 1,2-dimethylhydrazine, and $NH_3$.

7. The process of claim 1, wherein the reducing gas is $H_2$ and the temperature is about 300 to about 600° C.

8. The process of claim 1, wherein the reducing gas comprises $H_2$.

9. The process of claim 1, wherein the oxidizing gas comprises $H_2O$ vapor.

10. The process of claim 1, wherein the duration of (i) is about 100 microseconds to about 1 second.

11. The process of claim 1, wherein the duration of (i) is about 0.15 to about 0.35 seconds.

12. The process of claim 1, wherein the duration of (ii) is about 0.5 to about 3 seconds.

13. The process of claim 1, wherein the duration of (ii) is about 0.8 to about 1.2 seconds.

14. The process of claim 1, wherein the duration of (iii) is about 50 to about 200 seconds.

15. A process for forming a molybdenum-containing material on a substrate, wherein the substrate is chosen from titanium nitride, tantalum nitride, aluminum nitride, aluminum oxide, zirconium oxide, hafnium oxide, silicon dioxide, silicon nitride, lanthanum oxide, ruthenium oxide, iridium oxide, niobium oxide, and yttrium oxide, comprising contacting the substrate with Mo(CO)$_6$, under pulsed vapor deposition conditions, wherein the pulsed vapor deposition conditions comprise:
- (i) exposure of the substrate to Mo(CO)$_6$ for a period of about 100 microseconds to about one second;
- (ii) exposure of the substrate to H$_2$O vapor for a period of about 0.8 to about 1.2 seconds; and
- (iii) exposure of the substrate to hydrogen gas for a period of about 75 seconds to about 125 seconds, and
- the molybdenum-containing material is molybdenum metal and wherein the water vapor is mixed only with one or more inert gases.

16. The process of claim 15, wherein (i), (ii), and (iii) are repeated until a desired thickness of a molybdenum-containing material has been deposited on the substrate.

* * * * *